United States Patent [19]
Weissmueller, Jr.

[11] 3,961,267
[45] June 1, 1976

[54] CHANNEL SELECTING CONTROL SYSTEM FOR TELEVISION TUNER INCLUDING UNUSED CHANNEL SKIP SYSTEM

[75] Inventor: William R. Weissmueller, Jr., Wildwood, Ill.

[73] Assignee: Warwick Electronics Inc., Chicago, Ill.

[22] Filed: Nov. 1, 1974

[21] Appl. No.: 520,030

[52] U.S. Cl. .............................................. 325/470
[51] Int. Cl.² ........................................ H04B 1/32
[58] Field of Search ........... 325/464, 465, 468, 470, 325/471; 334/26

[56] References Cited
UNITED STATES PATENTS

| | | | |
|---|---|---|---|
| 3,515,960 | 6/1970 | Buhr | 325/471 |
| 3,584,307 | 6/1971 | Hewie | 325/471 |
| 3,714,585 | 1/1973 | Koch | 325/468 |
| 3,839,681 | 10/1974 | Mogi | 325/464 |
| 3,849,731 | 11/1974 | Morita | 325/464 |

Primary Examiner—Albert J. Mayer
Attorney, Agent, or Firm—Wegner, Stellman, McCord, Wiles & Wood

[57] ABSTRACT

In a television receiver, a tuning voltage for a varactor tuner is generated by the actuated stage of a plural step neon lamp memory in which each memory stage corresponds to a different television channel. The memory stages are connected as a ring counter which is stepped sequentially by a two-speed oscillator having a fast scan for undesired channel representing stages, and a slow scan to maintain actuation for a short time period of selected memory stages which correspond to desired channels which are to be viewed. Each memory stage includes a potentiometer with a wiper adjusted to generate the tuning voltage. To preprogram the undesired channel representing stages, the potentiometers in the stages are adjusted to produce maximum voltage, which is detected by a threshold switch to cause the oscillator to rapidly step to the next memory stage. A counter detects when all memory stages have been scanned and then disables the oscillator thereby stopping the scanning to maintain selection of the original channel.

14 Claims, 3 Drawing Figures

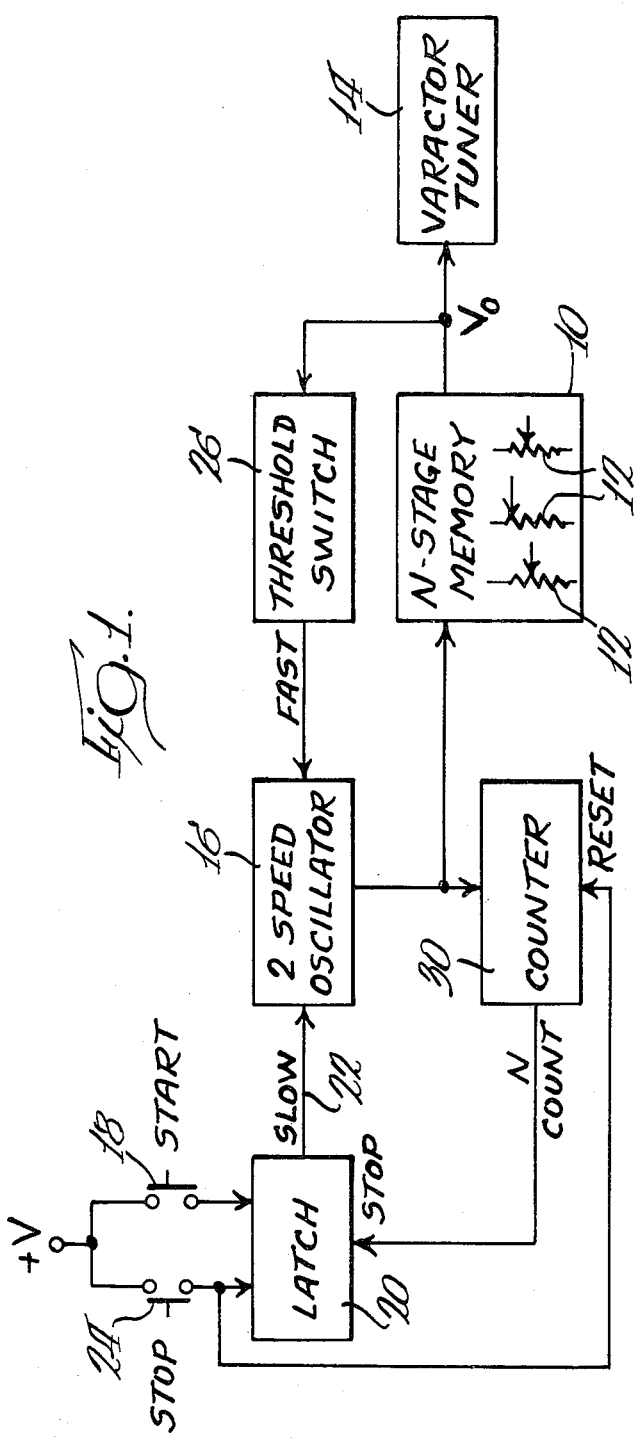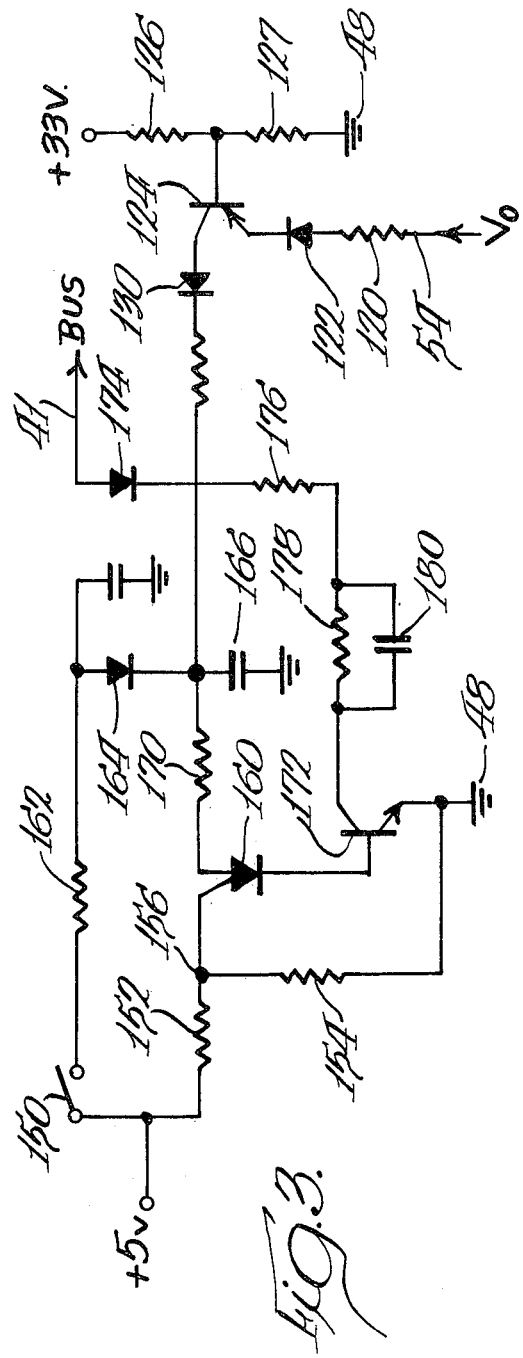

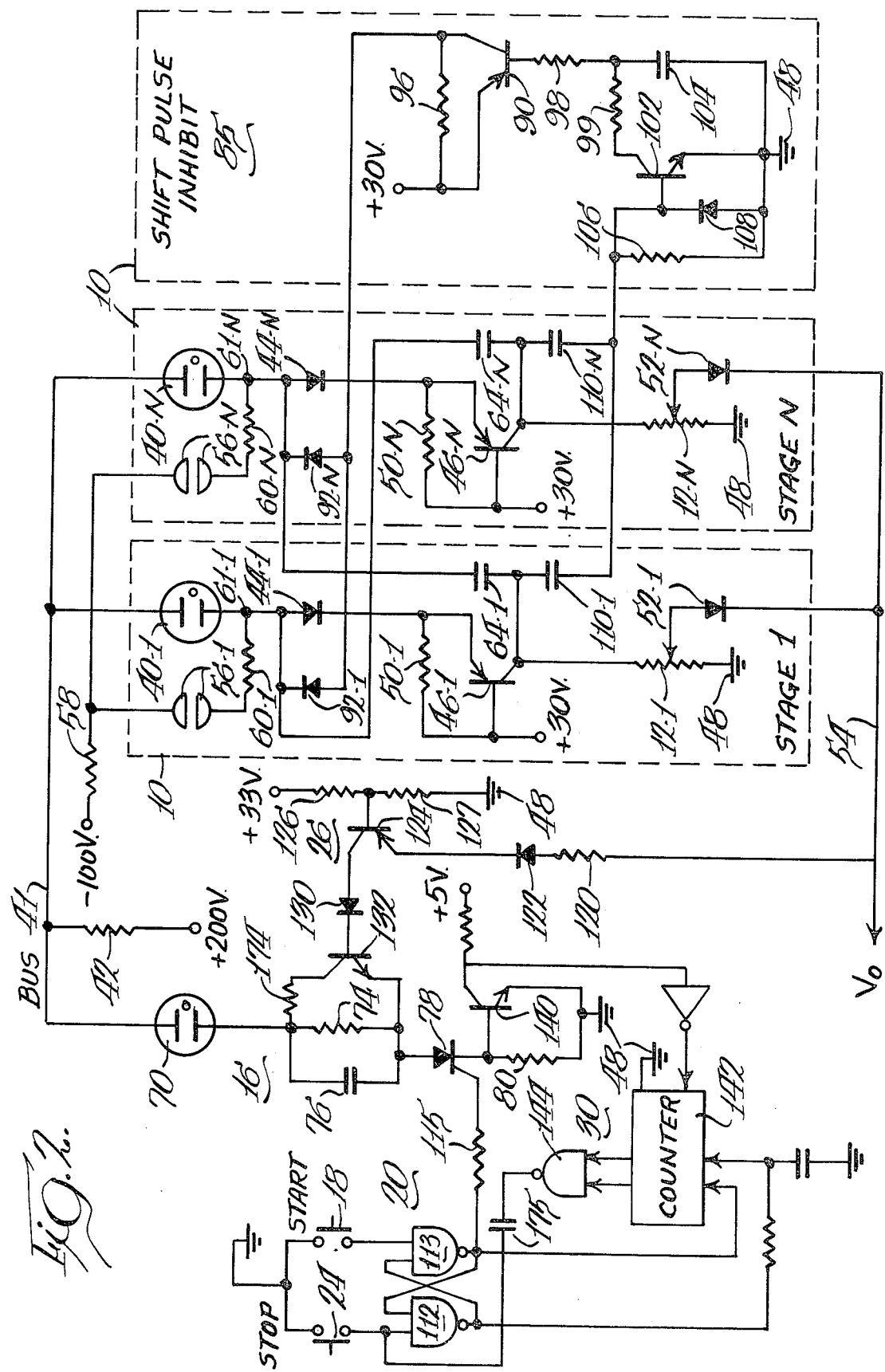

CHANNEL SELECTING CONTROL SYSTEM FOR TELEVISION TUNER INCLUDING UNUSED CHANNEL SKIP SYSTEM

BACKGROUND OF THE INVENTION

This invention relates to a programmable tuning selector for sequential actuation of a tuner in a receiver.

Programmable channel selection refers to the ability to skip (or to appear to skip) undesired channels during sequential channel stepping of a television tuner. Upon viewer actuation of a scanning switch, the tuning system sequentially steps through each television channel to allow a viewer to stop the scanning sequence on a desired channel. The channels which are not utilized in a given reception area should be rapidly scanned, giving the appearance of skipping the channel, while the channels which carry programs in a given reception area should be scanned slowly, providing a hesitation or dwell time which allows the viewer to decide whether he wishes to stop the automatic scanning sequence and view a particular channel.

For example, in Konopka U.S. Pat. No. 3,746,886 issued July 17, 1973, and assigned to the same assignee as the present application, individual program switches can be closed to cause a two-speed oscillator to rapidly step through neon stages which represent undesired channels. While the Konopka programmable tuning scanner operates satisfactorily, it has the disadvantage of requiring separate programmable channel switches in addition to the channel tuning potentiometers which are required in each neon memory stage to generate the tuning voltage for the varactor tuner.

Other types of television tuning scanners which can dwell on preselected channels are well known. Evans U.S. Pat. No. 3,602,822 and Imazeki U.S. Pat. No. 3,794,925 both show channel scanning systems using counters stepped by an oscillator to select desired channels. However, all such systems require separate channel selection switches to disable undesired channel representing stages (or alternatively to enable desired channel representing stages) which are in addition to the channel tuning potentiometers.

Prior scanning systems have automatically stepped until reaching the next channel, or have automatically stepped until the viewer stopped the stepping sequence. The first type of system has the disadvantage of requiring the viewer to manually intervene in order to continue stepping should the viewer not desire to view the next channel. The second type of system has the disadvantage of continuing to step indefinitely through all channels when completion of a scanning sequence through all available channels typically indicates that the viewer does not wish to change from the channel originally being received.

SUMMARY OF THE INVENTION

In accordance with the present invention, an improved programmable tuning selector for a receiver tuning system eliminates the program selection switches which have heretofore been necessary to enable desired channels, or disable undesired channels, in a given reception area. Instead, the adjustable tuning voltage generator which generates the tuning voltage for an electrically controlled tuner is also used to program channels which are to be selected or unselected in a given viewing area. Upon initiation of an automatic tuning scan, the system will step rapidly through unselected channels, and dwell on selected channels, until completing a tuning cycle. The system will then automatically disable upon returning to the original channel to which the receiver was tuned when the automatic tuning scan was initiated.

One object of the present invention is the provision of a programmable tuning system in which the adjustable device for selecting a tuning frequency also forms the programmable channel selector, eliminating the necessity for separate channel selector switches.

Another object of the present invention is the provision of a sequential tuning system in which initiation of an automatic tuning scan will cause sequential stepping through each selected channel, and will disable the automatic scanning system upon stepping through all available channels so as to return to the original channel to which the receiver was tuned when the automatic tuning scan was initiated.

Other objects and features of the invention will be apparent from the following description and from the drawings. While illustrative embodiments of the invention are shown in the drawings and will be described in detail herein, the invention is susceptible of embodiment in many different forms and it should be understood that the present disclosure is to be considered as an exemplification of the principles of the invention and is not intended to limit the invention to the embodiments illustrated.

BRIEF DESCRIPTION OF THE DRAWINGS

FIG. 1 is a block diagram of the novel programmable tuning scanner for an electrically controlled tuner in a television receiver;

FIG. 2 is a schematic diagram of the circuit shown in block form in FIG. 1; and

FIG. 3 is a schematic diagram of an alternate embodiment of the novel programmable tuning scanner, in which the illustrated circuit is substituted for the left-hand portion of the circuit shown in FIG. 2.

DESCRIPTION OF THE PREFERRED EMBODIMENTS

Turning to FIG. 1, a programmable tuning scanner is illustrated which can automatically step rapidly through undesired frequencies or channels, and can step slowly through preselected channels in order to allow an operator to stop the scanner at any desired channel. The scanner includes a plural stage memory 10 having N stages with each stage including an adjustable device, such as a potentiometer 12, which is variable to select a DC tuning voltage $V_O$ which is coupled to a voltage controlled varactor tuner 14. When utilized in a television receiver, a separate memory stage is provided for each VHF channel, and for a certain number of UHF channels. The plural stage memory 10 forms a ring counter which can be sequentially actuated by clock or shift pulses from a two-speed oscillator 16.

Assuming that the television receiver is tuned to a particular channel, and that a viewer desires to scan to other channels, a push-to-start switch 18 is depressed in order to cause a latch 20 to produce an enabling output 22 which causes the oscillator 16 to sequentially enable each memory stage. At any time, the viewer can actuate a momentary stop switch 24, in order to reset the latch 20 to its stop condition and thereby disable the oscillator 16. The varactor tuner 14 will then remain tuned to the channel then being viewed.

Since the plural stage memory 10 will contain more stages than the number of channels which are utilized in any given reception area, the stages corresponding to unused channels are rapidly scanned at a sufficiently fast rate so as to appear to a viewer to have been skipped and hence are effectively skipped. For the purpose of programming the scanner to effectively skip undesired channels, the potentiometers 12 which select the tuning voltage $V_O$ are adjusted in each stage which is to be skipped to an end position such as maximum voltage. When the oscillator 16 steps the memory to such a programmed stage, the output voltage $V_O$ goes to a maximum value which is detected by a threshold switch 26 which alters the time constant of the oscillator 16. The oscillator now immediately generates the next clock pulse, stepping the memory to the next stage. In this manner, undesired stages are rapidly sequentially actuated, and appear to be skipped, whereas desired stages are slowly scanned with the potentiometers 12 in those stages controlling the frequency to which the tuner 14 is tuned.

Upon initiation of a scanning cycle, the shift pulses from oscillator 16 are also coupled to a counter 30 which counts to a number N corresponding to the number of stages N in the plural stage memory 10. Since the memory is in the form of a ring counter, it will continuously step through all stages and then return to the original stage to which the memory was tuned when the scanning cycle was initiated. At this time, the counter 30 will generate an N count signal which stops the latch 20 and disables the oscillator 16. The original channel stage to which the receiver was tuned will now remain actuated until the operator initiates another automatic scanning cycle by actuation of the start switch 18, or by individual selection of a different channel stage, as will appear. Should the operator terminate the scanning sequence prior to returning to the original channel, by actuation of the stop switch 24, this will also reset the counter 30 to its zero count so that the channel stage then actuated will become the new original or reference channel upon initiation of another automatic scanning sequence.

The system for scanning all desired channels and automatically returning to the original channel to which the receiver was tuned when the scanning cycle was initiated can be applied to mechanical detent tuners as well as to electrically operate tuners. In place of counting clock pulses, the counter 30 may count detent positions of a mechanically actuated tuner, as by providing a switch which is closed for each detented position of the tuner. Thus, a remote control system in which a motor rotated a detented mechanical tuner could be adapted to the present system.

Turning to FIG. 2, the programmable tuning scanner of FIG. 1 has been illustrated in detail. Illustratively, the N stage memory 10 is shown as a triggered neon lamp memory circuit of the type disclosed in Konopka U.S. Pat. No. 3,746,886, assigned to the same assignee as the present application. However, other types of memory stages could be utilized with the present invention. The operation of the illustrated memory stages 10 will be described in so far as necessary for an understanding of the present invention, however, for a more complete description reference should be made to the Konopka U.S. Pat. No. 3,746,886. Since the components in each memory stage are the same, corresponding components have been given the same numerals, followed by a number corresponding to the particular stage in which the component is located. For clarity, only the first memory stage 1 and the last memory stage N have been illustrated, it being understood that 16 stages may be provided for the twelve VHF channels and for four UHF channels.

Each memory stage includes a memory element in the form of a voltage breakdown device such as a neon lamp 40 which has a trigger voltage of approximately 110 volts and a sustaining voltage of approximately 75 volts. All neon lamps 40 have one side coupled via a bus line 41 and through a common resistor 42 to a source of +200 volts DC. The other sides of the neon lamps 40 are coupled through a diode 44 to the emitter of a switching transistor 46 which either clamps or disconnects a source of +30 volts to one side of the associated tuning potentiometer 12. The opposite side of the tuning potentiometer is connected directly to a source of reference potential or ground 48. The emitter of the switching transistor 46 is coupled through a resistor 50 to its base and +30 volt source. The wiper of each potentiometer 12 is coupled through an isolation diode 52 to a common output line 54 which carries thereon the DC tuning voltage $V_O$ which controls the frequency of the varactor tuner in accordance with the amplitude of the DC tuning voltage.

resistor allow a viewer to manually select any channel, at any time, a pair of touch contacts 56 have one side coupled through a common register 58 to a source of −100 volts. The opposite side is coupled through a resistor 60 to a junction 61 between the neon lamp 40 and the diode 44. When the viewer's finger bridges the pair of touch contacts 56, the voltage drop across the associated neon lamp 40 will exceed the trigger voltage, and the lamp will switch to its actuated, low impedance state. The resulting current flow will forward bias the associated switching transistor 46, causing +30 volts (minus a constant semiconductor junction drop) to be switched across the associated potentiometer 12. This will cause the resulting tuning voltage $V_O$ to correspond to the position of the wiper of the potentiometer. The light emitted by the actuated neon lamp 40 will also serve as a visual indicator of the selected channel.

For automatic channel selection, the memory stages are connected as a ring counter which can be stepped by clock pulses from the oscillator 16. In particular, the collector of each switching transistor 46 is connected through a capacitor 64 to the junction 61 in the next adjacent stage. The capacitor 64-N in the last stage N is connected to point 61-1 to complete the loop for the ring counter. The ring counter is also formed by portions of the shift pulse inhibit circuit, to be described later.

For sequential stepping of the ring counter, a two-speed oscillator 16 is formed by a neon lamp 70 and an RC network which forms a relaxation oscillator. One side of the neon lamp 70 is directly coupled to the bus line 41. The opposite side of the neon lamp 70 is coupled through a resistor 74 and a parallel connected capacitor 76 to the anode of an SCR 78 which has its cathode coupled through a resistor 80 to ground 48.

When SCR 78 is switched to its conductive state, the neon lamp 70 is triggered and this causes the voltage on the bus line 41 to drop below the sustaining level necessary to maintain actuation of the neon lamps 40. Assuming for example that neon lamp 40-1 had been actuated, the triggering of neon lamp 70 would cause the neon lamp 40-1 to become nonconductive by dropping the voltage on bus 41 thereby switching off the transistor 46-1. This would unclamp +30 volts from across potentiometer 12-1, causing capacitor 64-1 to discharge and in effect create a negative going shift pulse which would drop the potential at neon lamp 40-2 (not illustrated) sufficiently so that the total voltage drop would exceed the triggering potential. This would trigger the neon lamp 40-2 and thereby actuate the second stage.

Meanwhile, when neon lamp 70 was triggered, the current flow therethrough would change the capacitor 76 to a point that the voltage drop across the neon lamp 70 would no longer exceed its sustaining voltage. The neon lamp 70 will now become nonconductive, and the voltage stored in capacitor 78 will dissipate through resistor 74. Depending on the RC time constant, the voltage will dissipate sufficiently after a "long" time delay so that the voltage drop across the neon lamp 70 will again exceed the trigger voltage, causing the neon lamp 70 to trigger and thereby drop the bus 41 voltage sufficiently to cause the neon lamp 40-2 to switch off. The ring counter circuit will now trigger the neon lamp 40-3 (not illustrated). In this manner, the deactuation of each previously actuated stage causes actuation of the next memory stage.

While deactuation of one stage automatically activates the next stage when the oscillator 16 is enabled, it will be appreciated that individual actuation of a stage through bridging of the associated touch contacts 56 actuates only that memory stage and not any others. A shift pulse inhibit circuit 85 provides this function (and also forms a part of the shifting circuit). The shift pulse inhibit circuit 85 includes a transistor 90 having its emitter coupled to the same +30 volt source as the bases of the transistors 46, and its collector coupled through individual diodes 92 in each stage to the junctions 61. The collector-to-emitter junction of transistor 90 is shunted by a resistor 96. The base of transistor 90 is coupled through resistors 98 and 99 to the collector of a transistor 102 having its emitter directly tied to ground 48. The junction between resistors 98 and 99 is shunted to ground through a capacitor 104. The base of transistor 102 is shunted to ground through a resistor 106 which is shunted by a diode 108. The base is also coupled through individual capacitors 110 in each stage to the collector of the transistor 46 in the same stage.

When a stage 10 is triggered on, the +30 volts switched across the potentiometer 12 produces a positive pulse which is coupled through the capacitor 110 to forward bias transistor 102. The conducting transistor 102 turns on transistor 90, producing a positive voltage pulse, if current is then flowing through resistor 96, to inhibit the negative going shift pulse produced during manual selection of a stage.

For example, if neon lamp 40-1 was conducting and the touch contact 40-3 (not illustrated) of stage 3 was bridged by the viewer's finger, neon lamp 40-3 (not illustrated) would go on, dropping the bus voltage and causing neon lamp 40-1 to go off. The turning off of neon 40-1 would produce a current flow through capacitor 64-1 which in turn would cause current to flow through resistor 96. However, the turning on of neon lamp 40-3 would forward bias transistors 102 and 90, effectively creating a positive pulse which would cancel the negative shift pulse which otherwise would trigger on neon lamp 40-2. The neon lamp 40-3 will remain on, however, since more than the sustaining voltage is across it.

By contrast, it will now be assumed that neon lamp 40-1 is on and the viewer has actuated the start switch 18 for automatic stepping of the memory circuit. The SCR 78 is actuated and causes triggering of neon lamp 70, lowering the voltage on the bus 41 below the sustaining level. Neon lamp 40-1 will turn off, creating a negative going shift pulse through capacitor 64-1. Since no other neon lamp is turning on at this time, no cancelling pulse is created, and hence the next neon lamp 40-2 (not illustrated) will be turned on. The turning on of neon lamp 40-2 will turn on its associated transistor 46-2 and hence cause transistors 102 and 90 to be forward biased. However, the negative going shift pulse has already occurred, and hence the shift pulse inhibit circuit 85 produces no change in the neon lamp memory circuit.

Latch circuit 20 includes a pair of cross-coupled NAND gates 112 and 113 connected as a flip-flop. The output of NAND gate 113 is coupled through a resistor 115 to the gate of SCR 78. When the start switch 18 is momentarily closed, NAND gate 113 has a 1 bit output which maintains SCR 78 actuated until the latch is turned off, either by momentary actuation of the stop switch 24, or by generation of a 0 bit from the counter circuit 30.

Actuation of SCR 78 connects neon lamp 70 across a voltage in excess of its trigger potential, triggering the neon and stepping the memory circuit to the next stage. This connects +30 volts across the potentiometer 12 of the next stage, generating a positive voltage on line 54 which corresponds to the tuning voltage $V_o$.

In order to program the circuit to rapidly step past as undesired channel, the potentiometer 12 of the corresponding stage is adjusted to produce a predetermined voltage which is detected by the threshold switch 26 and which switches the oscillator 16 to its high frequency operation. This is accomplished by running the wiper of the potentiometer 12 toward the collector of transistor 46, causing +30 volts to be coupled onto the wiper when the corresponding stage is actuated. Threshold switch 26 detects the presence of the maximum voltage level and alters the time constant of the oscillator.

In particular, the tuning voltage output line 54 is coupled through a resistor 120 and a diode 122 to the input or emitter of a transistor 124 which forms a voltage comparator. A reference source is formed by a voltage divider consisting of a resistor 126 and a resistor 127 in series between +33 volts and ground 48. The junction between resistors 126 and 127 is coupled to another input formed by the base of transistor 124. The output or collector of transistor 124 is coupled through a diode 130 to a switching transistor 132 having its collector-emitter junction coupled across the resistor 74. As the voltage $V_o$ exceeds the preselected switching voltage as determined by the voltage divider resistors 126 and 127, the transistor 124 is driven conductive and this forward biases transistor 132, causing the capacitor 76 to quickly discharge through resistor 174 and immediately turning on neon lamp 70. This causes the neon lamp memory stage than actuated to turn off and thus immediately actuate the next stage.

If the next stage should have its potentiometer wiper adjusted to the skip position, transistors 124 and 132 will again be driven conductive and the oscillator 16 will again generate a new stepping pulse. The RC time constant due to 74 and 76 may be selected so as to produce an oscillation rate of approximately one-third Hertz. When resistor 74 is paralleled with resistor 174 by the actuated transistor 132, the oscillation rate may be approximately 30 Hz. Thus, the same adjustable device which selects the channel voltage serves the dual purpose of forming the programmable switch for allowing a channel to be skipped. This eliminates a duplicate set of controls for programming the television receiver to selected and unselected channels.

The stepping pulses produced as neon lamp 70 turns on and off cause a transistor 140 to generate pulses which are counted by a binary counter 142 which forms a part of the counter stage 30. A NAND gate 144 has inputs coupled to the outputs of the binary counter 142 in order to detect when a number N is reached which corresponds to the number of stages N of the ring counter memory. Upon reaching an N count, a 0 bit is generated and differentiated by capacitor 175. The resulting negative going transient changes the latch 20 to the stop state. Thus, the ring counter will cycle through all stages and return to the originally actuated stage if the operator does not depress the stop switch 24 prior to completion of the stepping cycle.

Any memory stage may form the originally actuated or reference stage when the automatic cycle operation is begun. The stage may be enabled either due to previous automatic cycle operation and actuation of the stop switch (or return to the original stage), or by individual station selection by the operator touching the contacts 56. Both of the NAND gates 112 and 113 have outputs coupled to the clear or reset inputs of the counter 142. Thus, upon starting from any selected stage by actuation of start switch 18, the counter 142 is reset and then the selected stage becomes the new reference stage upon initiation of another automatic scanning cycle. Whenever the number of stages N to be scanned equals the natural modulo of the counter, such as 16 channels when a four-bit counter 142 is utilized some savings can be realized by deleting the decoder 144 since the counter can be stopped by resetting to the binary zero state which also will be the state required for start-up.

In FIG. 3, an alternate embodiment of the invention is illustrated in which automatic return to the initial channel has been eliminated. The illustrated circuit of FIG. 3 would be substituted for the oscillator 16, counter 30, and latch 20 shown in FIG. 2, and thus would connect to the bus line 41 and to the tuning output line 54 of FIG. 2. A start-stop switch 150 is closed whenever the viewer wishes to scan channels, and is opened when the automatic scan is to terminate. The single pole, single throw switch 150 can be a momentary type which must be hand depressed by the operator, or a latching type such as a push-push switch. A +5 volt source is coupled to a pair of voltage divider resistors 152 and 154 which generate at their junction 156 a predetermined switching voltage which is coupled to the gate of a programmable unijunction transistor (PUT) 160.

When automatic scan is to be initiated, the viewer closes switch 150 and thus connects the +5 volt source through a resistor 162 and a diode 164 to a capacitor 166 which now charges with a low-speed time constant as determined by resistor 162 and capacitor 166. When capacitor 166 charges up to equal the voltage on the gate of PUT 160, the PUT 160 fires and discharges capacitor 166 through a resistor 170 and the PUT 160 to the base of a switching transistor 172. This turns on the transistor 172, allowing the positive voltage on the bus 41 to be dropped by current flow through a diode 174, a resistor 176, a resistor 178 which is shunted by a capacitor 180, and the collector-emitter junction of transistor 172 to ground 48. This in effect puts a negative going shift pulse on the neon lamp bus 41 as capacitor 180 charges, causing the memory circuit to step to the next stage in the same manner as when neon lamp 70 of FIG. 2 had been triggered on. The discharge time is determined primarily by the time constant of capacitor 166 and resistor 170.

As capacitor 166 discharges sufficiently, the PUT 160 will be turned off and a new charge cycle will begin. Thus, the PUT 160 and associated components forms a relaxation oscillator having a low frequency time constant to allow a dwell time in which the viewer can decide whether to open the switch 150.

When the neon memory steps to a stage having the wiper of its tuning potentiometer adjusted to the maximum voltage position, the threshold switch 124 is actuated and this causes capacitor 166 to immediately charge to a level in excess of the firing potential at junction 156. Thus, the relaxation oscillator has a high frequency which rapidly steps through the unselected channels as determined by the setting of the potentiometer wipers.

Various modifications may be made without departing from the present invention. For example, while the maximum voltage output from the tuning potentiometers 12 has been utilized as the switching level for the threshold switch 26, it will be appreciated that any voltage level which does not correspond to a desired tuning voltage could be utilized to shorten the actuation time of the oscillator. For example, the wipers could be rotated to the grounded end and detector 26 could be a zero voltage detector. Other changes will be apparent in view of the above teachings.

Having described the invention, the embodiments of the invention in which an exclusive property or privilege is claimed are defined as follows:

1. In a receiver having an electrically controlled tuner, a sequential tuning system comprising:
   a plurality of actuable stages corresponding to a plurality of frequencies only some of which are to be selected, each stage having an adjustable resistor which can be varied to change the level of a tuning signal coupled when the stage is actuated to the tuner to control the frequency thereof;
   each adjustable resistor being adjustable to generate a predetermined level of tuning signal when the associated stage is to be effectively skipped during a scanning sequence;
   sequence means for sequentially actuating at a slow rate each of the plurality of stages to sequentially generate tuning signals from the adjustable resistor in order to step the tuner sequentially through the entire plurality of frequencies;
   switch means responsive to generation of tuning signals having the predetermined level for causing the sequence means to step at a fast rate to actuate the next stage to thereby effectively skip stages which are not to be selected during the scanning sequence;
   frequency stopping means actuable for stopping the sequence means when the tuner has been stepped to any desired frequency in order to maintain the receiver tuned to the desired frequency; and
   cycle stopping means for stopping the sequence means after the entire plurality of frequencies has been scanned once without actuation of the stopping means in order to return the tuner to the frequency to which the tuner was tuned when automatic scanning was initiated by actuation of the sequence means.

2. The sequential tuning system of claim 1 wherein the plurality of actuable stages are connected in a ring counter circuit which is stepped by shift pulses, and the sequence means includes a two-speed oscillator for generating the shift pulses at a slow rate or at a fast rate in response to the switch means.

3. The sequential tuning system of claim 2 wherein each actuable stage has a memory element which when actuated remains actuated until the occurrence of another shift pulse, and second switch means responsive to actuation of the memory element for coupling a reference potential across the adjustable resistor in the associated stage to generate the tuning signal.

4. The sequential tuning system of claim 3 wherein each stage includes an individual selector means for manual individual actuation of the associated memory element independent of the sequence means, and the ring counter circuit includes inhibit means responsive to actuation of any memory element by the individual selector means associated therewith for inhibiting the sequential stepping operation otherwise produced by the ring counter circuit.

5. The sequence tuning system of claim 2 wherein the two-speed oscillator comprises a relaxation oscillator having a time period controlled by an RC network, and the switch means is coupled to the RC network and alters the time constant thereof when actuated.

6. The sequential tuning system of claim 5 including a momentary start switch, a momentary stop switch, a memory coupled to the start and stop switches for changing state in response to actuation of the switch, and means coupling the memory to the relaxation oscillator for initiating operation of the oscillator when the start switch is actuated.

7. The sequential tuning system of claim 1 wherein the adjustable resistors each comprise a potentiometer having a wiper adjustable to vary the voltage at the wiper when a reference voltage is coupled across the potentiometer, the voltage on the wiper corresponding to the level of the tuning signal, the wiper of each potentiometer being movable to an end position to generate a predetermined voltage corresponding to the predetermined level when the associated stage is to be effectively skipped during the scanning sequence, and each stage being responsive upon actuation to couple the reference voltage across the associated potentiometer.

8. The sequential tuning system of claim 7 wherein the switch means comprises a voltage responsive switch for detecting generation of the predetermined voltage for causing the sequence means to rapidly actuate the next stage.

9. The sequential tuning system of claim 8 wherein the voltage responsive switch comprises a voltage comparator having one input coupled to the wipers of all of the potentiometers, a second input coupled to a voltage divider for establishing a switching voltage corresponding to the predetermined voltage, and an output enabled when the voltages at the first and second inputs are approximately equal for causing the sequence means to rapidly actuate the next stage.

10. The sequential tuning system of claim 1 wherein the cycle stopping means includes a counter for counting at least to a cycle stop number equal to the number of frequencies to which the tuner can be stepped by the sequence means, means responsive to each stepping of the tuner for changing the count of the counter, and means responsive when the count equals the cycle stop number for stopping the sequence means.

11. The sequential tuning system of claim 10 wherein actuation of the frequency stopping means to stop the sequence means at the desired frequency also resets the counter to a zero count.

12. The sequential tuning system of claim 1 wherein the sequence means includes a plurality of actuable stages each having an adjustable resistor which can be adjusted to generate a tuning signal for controlling the frequency of the tuner when the corresponding stage is actuated, means connecting the plurality of actuable stages in a ring counter circuit, and oscillator means for generating shift pulses which step the ring counter circuit, the frequency stopping means and the cycle stopping means being effective to disable the oscillator means.

13. The sequential tuning system of claim 12 wherein each adjustable resistor is adjustable to generate a predetermined tuning signal when the associated stage is to be effectively skipped during a scanning sequence, and switch means responsive to generation of the predetermined tuning signal for causing the oscillator means to increase the frequency of the shift pulses and thereby rapidly step to the next stage.

14. The sequential tuning system of claim 13 wherein the cycle stopping means comprises a counter which counts to a number representing the number of actuable stages, means coupling the shift pulses from the oscillator to the counter to cause the counter to count for each shift pulse which steps the ring counter circuit, and means responsive to the counter reaching the number corresponding to the plurality of stages for terminating operation of the oscillator.

* * * * *